US009266716B2

(12) United States Patent
Feyh et al.

(10) Patent No.: US 9,266,716 B2
(45) Date of Patent: Feb. 23, 2016

(54) MEMS ACOUSTIC TRANSDUCER WITH SILICON NITRIDE BACKPLATE AND SILICON SACRIFICIAL LAYER

(71) Applicant: Robert Bosch GmbH, Stuttgart (DE)

(72) Inventors: Ando Feyh, Palo Alto, CA (US); Andrew Graham, Redwood City, CA (US)

(73) Assignee: Robert Bosch GmbH, Stuttgart (DE)

( * ) Notice: Subject to any disclaimer, the term of this patent is extended or adjusted under 35 U.S.C. 154(b) by 87 days.

(21) Appl. No.: 14/205,553

(22) Filed: Mar. 12, 2014

(65) Prior Publication Data

US 2015/0274506 A1    Oct. 1, 2015

Related U.S. Application Data

(60) Provisional application No. 61/780,940, filed on Mar. 13, 2013.

(51) Int. Cl.
| | |
|---|---|
| *H01L 29/84* | (2006.01) |
| *B81B 7/00* | (2006.01) |
| *F01D 15/10* | (2006.01) |

(Continued)

(52) U.S. Cl.
CPC . *B81B 7/007* (2013.01); *B81B 7/02* (2013.01); *B81C 1/00158* (2013.01);

(Continued)

(58) Field of Classification Search
CPC  H01L 2924/1461; H01L 41/08; H04R 19/04; H04R 19/016; H04R 1/406; H04R 2201/003; B81B 2201/0257; B81B 2201/0264; B81B 2203/033; B81B 7/02; B81B 2201/047; B81B 2203/04; B81B 2203/051; B81B 2203/053; B81B 7/007; B81B 3/0021; B81B 3/0024; B81B 3/0051; B81C 1/00015; B81C 1/00158; B81C 2201/014; B81C 1/00047; B81C 1/00134; B81C 1/00301; B81C 1/00603; B81C 1/00801; B81C 2201/0116; C23C 16/345; A61B 8/4483; A61B 2562/028; B06B 1/0292; G01N 29/2437; G02B 21/00; G02B 6/036; G02B 6/10; G02B 7/188
USPC ........... 381/116; 257/415, 416, 254; 356/480; 374/163, 70; 385/129, 131, 12, 130, 385/132; 438/791, 700
See application file for complete search history.

(56) References Cited

U.S. PATENT DOCUMENTS

| | | | |
|---|---|---|---|
| 8,063,458 | B2 | 11/2011 | Loeffler et al. |
| 8,174,085 | B2 | 5/2012 | Nakatani |

(Continued)

OTHER PUBLICATIONS

International Search Report and Written Opinion corresponding to PCT Application No. PCT/US2014/024147, mailed Jun. 26, 2014 (12 pages).

*Primary Examiner* — Dao H Nguyen
*Assistant Examiner* — Tram H Nguyen
(74) *Attorney, Agent, or Firm* — Maginot Moore & Beck LLP

(57) ABSTRACT

A microelectromechanical system (MEMS) microphone has a substrate including a backside trench, and a flexible membrane deposited on the substrate extending over the backside trench. The flexible membrane includes a first electrode. A silicon spacer layer is deposited on a perimeter portion of the flexible membrane. The spacer layer defines an acoustic chamber above the membrane and the backside trench. A silicon rich silicon nitride (SiN) backplate layer is deposited on top of the silicon spacer layer extending over the acoustic chamber. The backplate defines a plurality of opening into the acoustic chamber and includes a metallization that serves as a second electrode.

19 Claims, 5 Drawing Sheets

(51) Int. Cl.
*F02C 7/36* (2006.01)
*F02C 9/00* (2006.01)
*H02J 9/06* (2006.01)
*F02C 7/268* (2006.01)
*F02C 7/32* (2006.01)
*B81B 7/02* (2006.01)
*B81C 1/00* (2006.01)

(52) U.S. Cl.
CPC ........... *B81C 1/00301* (2013.01); *F01D 15/10* (2013.01); *F02C 7/268* (2013.01); *F02C 7/32* (2013.01); *F02C 7/36* (2013.01); *F02C 9/00* (2013.01); *H02J 9/061* (2013.01); *B81B 2201/0257* (2013.01); *B81B 2201/0264* (2013.01); *F05D 2220/76* (2013.01); *F05D 2270/62* (2013.01)

(56) References Cited

U.S. PATENT DOCUMENTS

| | | |
|---|---|---|
| 2007/0284682 A1 | 12/2007 | Laming et al. |
| 2009/0152655 A1 | 6/2009 | Laming et al. |
| 2012/0091546 A1 | 4/2012 | Langereis et al. |
| 2012/0148071 A1* | 6/2012 | Dehe ............... H04R 1/005 381/116 |
| 2012/0319174 A1 | 12/2012 | Wang |
| 2012/0319219 A1 | 12/2012 | Diamond et al. |
| 2012/0326249 A1 | 12/2012 | Rombach |
| 2014/0225204 A1* | 8/2014 | Nakagawa ......... H04R 19/04 257/416 |
| 2015/0078593 A1* | 3/2015 | Uchida ............. H04R 19/04 381/191 |

* cited by examiner

MEMS ACOUSTIC TRANSDUCER WITH SILICON NITRIDE BACKPLATE AND SILICON SACRIFICIAL LAYER

CROSS-REFERENCE TO RELATED APPLICATIONS

This application claims priority to U.S. Provisional Application Ser. No. 61/781,940 entitled "MEMS ACOUSTIC TRANSDUCER WITH SILICON NITRIDE BACKPLATE AND SILICON SACRIFICIAL LAYER" by Feyh et al., filed Mar. 14, 2013, the disclosure of which is hereby incorporated herein by reference in its entirety.

TECHNICAL FIELD

This disclosure relates generally to microphones, and, in particular, to microelectromechanical systems (MEMS) microphones.

BACKGROUND

Consumer electronics devices are continually getting smaller and, with advances in technology, are gaining ever increasing performance and functionality. This is clearly evident in the technology used in consumer electronic products such as mobile phones, laptop computers, MP3 players and personal digital assistants (PDAs). Requirements of the mobile phone industry for example, are driving the components to become smaller with higher functionality and reduced cost. It is therefore desirable to integrate functions of electronic circuits together and combine them with transducer devices such as microphones and speakers.

The result of this is the emergence of micro-electrical-mechanical-systems (MEMS) based transducer devices. These may be for example, capacitive transducers for detecting and/or generating pressure/sound waves or transducers for detecting acceleration. There is a continual drive to reduce the size and cost of these devices through integration with the electronic circuitry necessary to operate and process the information from the MEMS through the removal of the transducer-electronic interfaces. One of the challenges in reaching these goals is the difficulty of achieving compatibility with standard processes used to fabricate complementary-metal-oxide-semiconductor (CMOS) electronic devices during manufacture of MEMS devices. This is required to allow integration of MEMS devices directly with conventional electronics using the same materials and processing machinery. This invention seeks to address this area.

DETAILED DESCRIPTION

Figure 1:
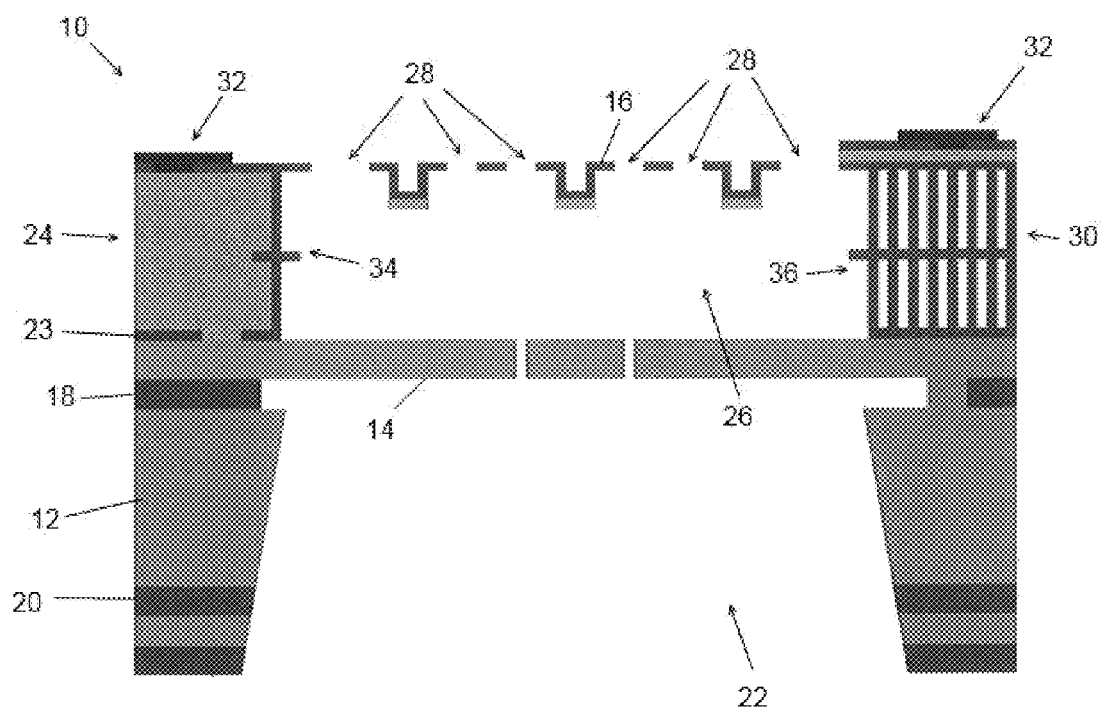
FIG. 1 depicts a cross-sectional view of an embodiment of a MEMS microphone in accordance with the present disclosure.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one of ordinary skill in the art to which this disclosure pertains.

FIG. 1 depicts a perspective view of an embodiment of a MEMS acoustic transducer 10 in accordance with the present disclosure. The MEMS acoustic transducer can be a microphone, a receiver, a speaker, or combination thereof. A MEMS microphone 10 is illustrated herein. The MEMS microphone includes a substrate 12, a flexible membrane 14, and a stationary backplate 16. The substrate 12 comprises a complementary metal oxide semiconductor (CMOS) substrate, such as a silicon wafer or silicon on insulator (SOI) substrate, for integration into CMOS electronics and MOS processing techniques although it will be appreciated that other substrate materials and electronic fabrication techniques could be also be used. In the embodiment of FIG. 1, the silicon substrate 12 is subjected to thermal oxidation which forms thermal oxidation layers 18 and 20 on the front and back sides of the substrate, respectively. As an alternative to using thermal oxidation, the oxide layers may be deposited using, for example, a plasma enhanced chemical vapor deposition (PECVD). Other techniques are also possible.

The membrane 14 comprises a layer of flexible material, such as polysilicon, deposited onto the front side thermal oxidation layer 18 on the front side of the substrate 12. The substrate 12 includes a backside trench 22 that exposes the bottom surface of the membrane 14. The membrane 14 is configured to serve as a lower electrode for the MEMS microphone 10. The lower electrode may be integrated into the membrane 14 in any suitable manner, such as by implant doping of the membrane layer or by the deposition of a conductive film. Furthermore, the full membrane layer 14 can be conductive due to inclusion of dopants. The definition of the electrode is realized by patterning processes of the fully conductive film.

The backplate 16 is suspended above the membrane 14 and is configured to serve as a fixed upper electrode for the capacitive MEMS microphone 10. The backplate 16 is supported by a silicon spacer 24 that is formed on a thermal oxide layer 23 on the membrane 14. The silicon material of the spacer 24 is removed between the backplate 16 and the membrane 14 to form an acoustic chamber 26 that forms an air gap for the microphone. The backplate 16 includes a plurality of perforations or openings 28 that are configured to permit air to flow into the acoustic chamber 26 to impinge on the membrane 14.

In accordance with the present disclosure, the backplate is formed by a low stress silicon rich nitride (SiN) which is an etch-resistant, insulative material with good mechanical properties. A local metallization (not visible) is deposited onto the backplate 16 to form the upper electrode for the capacitive microphone. The metallization for the electrode may comprise any suitable metal material, such as platinum (Pt), aluminum (Al), titanium (Ti), and the like. In one embodiment, the metallization is deposited using an atomic layer deposition (ALD) process as a very thin film, e.g., 10 nm or less, so that it has little or no impact on the mechanical properties of the backplate 16. Another possibility is the use of a doped silicon film on top of a thin oxide. The silicon film serves as conductive electrode, the oxide film serves as a protection layer in the si-sacrificial layer etch step and is etched away in the later oxide etch process.

The lower electrode of the membrane 14 and the fixed upper electrode of the backplate 16 together form a parallel plate capacitor. During operation, sound waves entering the acoustic chamber through the porous backplate 16 cause the flexible membrane 14 to vibrate. As the membrane 14 vibrates, the distance between the membrane 14 and backplate 16 changes which causes a corresponding change in the capacitance between the lower and upper electrodes. In the embodiment of FIG. 1, the electrodes of the membrane 14 and the backplate 16 are electrically connected to bond pads 32 provided in bond pad regions 30 of the substrate. The bond pads are configured to connect the electrodes to readout and control circuitry (not shown). The readout and control circuitry is configured to monitor the capacitance between the membrane and the backplate and to output signals that are representative of the sound waves impinging on the membrane.

The use of low stress silicon rich nitride (SiN) for the backplate 16, in conjunction with silicon for the sacrificial/spacer layer enables a microphone setup with a high signal-to-noise ratio, e.g., SNR>65 dB, while simultaneously enabling CMOS integration so that the MEMS microphone can be implemented on the same chip with other types of sensors, such as MEMS pressure sensors. For example, SiN materials can provide a rigid, mechanically stable structure at small layer thicknesses, e.g., 1-3 μm, and that can be patterned to achieve a relatively high porosity without impacting the structural integrity of the backplate. This allows the dimensions of the air gap to be increased so that air flow behavior can be optimized without significantly impacting performance. This also enables the membrane 14 to be provided with low porosity which can enhance coupling to the device.

In addition, because SiN materials are more resistant to certain etchants, such as vapor-HF (hydrofluoric acid), that are typically used to etch silicon and silicon oxide materials during CMOS processing, the removal of the silicon sacrificial layers to release the backplate and form the air gap between the backplate and membrane can be performed as part of a normal CMOS flow. As can be seen in FIG. 1, SiN, or similar type of material such as tetraethyl orthosilicate (TEOS), is used to form plug structures 34 that extend between the backplate 16 and the substrate membrane 14. The plug structures are configured to serve as etch stops for the acoustic chamber as well as to increase mechanical stability and provide electrical insulation between the backplate 16 and the membrane 14.

Referring to FIG. 1, a SiN/TEOS plug structure 36 may also be incorporated into the device to provide electrical insulation and increased electrical resistance from the bond-pads to the substrate in the bond pad regions 32 of the device. In the embodiment of FIG. 1, the SiN/TEOS plug structure 36 is provided between the bond bad region 32 and the membrane layer 14 and forms a support framework that allows the conductive layers between the bond pads 32 and the membrane layer 14 to be removed or partially removed thereby increasing the electrical resistance.

Figure 2:
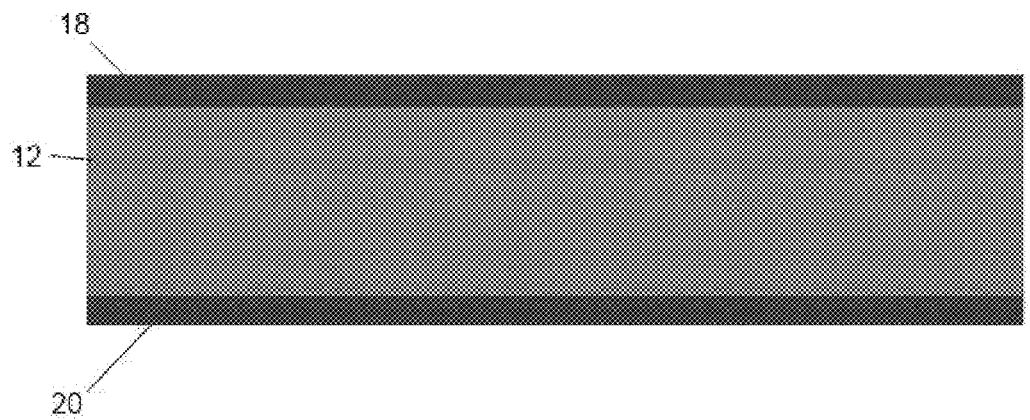
FIG. 2 depicts the substrate of FIG. 1 after thermal oxidation.

FIGS. 2-6 schematically depict an embodiment of a fabrication process for a MEMS microphone such as depicted in FIG. 1. Referring to FIG. 2, the fabrication process of the MEMS microphone starts with a silicon substrate 12 which is subjected to thermal oxidation to form thermal oxidation layers 18, 20 on opposing sides of the substrate 12. The thermal oxide layers 18, 20 may then be patterned to define features, such as contact regions or etch stops, such as etch stop 38 in FIG. 3.

Figure 3:
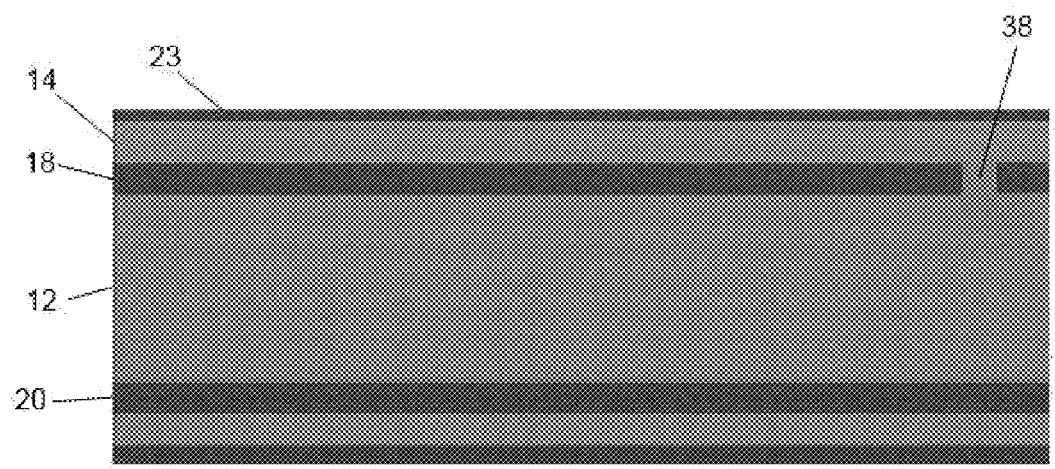
FIG. 3 depicts the substrate of FIG. 2 after the membrane layer for the MEMS microphone has been deposited and a thermal oxidation layer has been formed on the membrane layer.

As depicted in FIG. 3, a membrane/electrode layer 14 is deposited on the upper thermal oxidation layer 18 at a suitable thickness depending on the desired performance characteristics and patterned to define the desired size and shape of the lower electrode. In one embodiment, the membrane layer 14 comprises polysilicon deposited using low-pressure chemical vapor deposition (LPCVD) process. Not shown: the membrane layer 14 can be patterned with the desired perforation degree in order to allow a static pressure exchange from both sides of the membrane. Furthermore, the membrane (area and shape) itself is to be patterned. A thermal oxidation process is then performed to form the thin thermal oxide layer 23 on the upper surface of the membrane 14. The thermal oxide layer 23 protects the membrane 14 from the Si sacrificial etch that is used to form the air gap. The thermal oxide layer 23 is then patterned to define any desired features, such as contact region 40 (FIG. 4) and through holes for the plug structures 34, 36.

The silicon sacrificial/spacer layer structure 24 is then formed on the thermal oxide layer 23. The sacrificial silicon layer structure 24 may be formed in any suitable manner. In one embodiment, the silicon sacrificial layer structure comprises one or more layers of epitaxially grown silicon. The thickness and/or the number of silicon layers depends on the desired thickness of the air gap as well as the configuration of any structures, such as plugs and interconnects, incorporated into the device.

Figure 4:
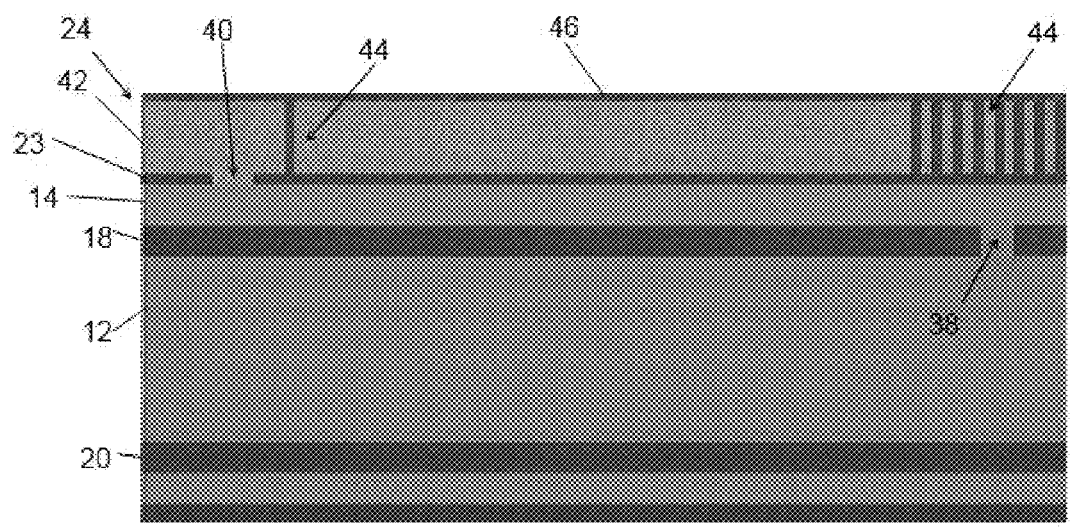
FIG. 4 depicts the substrate of FIG. 3 after a first sacrificial silicon layer has been deposited and portions of the plug structures formed therein.

In the embodiment of FIG. 1, the MEMS microphone 10 includes a stacked SiN/TEOS plug structure that is used to form etch stops and electrical insulation at the perimeter of the acoustic chamber 26. To form the stacked plug structure, a first sacrificial silicon layer 42 is deposited, e.g., epitaxially, on the thermal oxide layer 23 as depicted in FIG. 4. Plug trenches 44 for the plug structures 34, 36 are then formed in the first sacrificial silicon layer 42, e.g., by etching, at appropriate locations. The plug trenches 44 formed in the first sacrificial silicon layer 42 are then filled with an etch-resistant, insulative material, such as SiN or TEOS. A layer 46 of the same or similar type of material, such as SiN or TEOS, is also deposited on top of the first sacrificial layer 42 (same step as filling of trenches 44) and patterned around the plug structures to form horizontal parts 48 of the plug stacks (FIG. 5).

Figure 5:
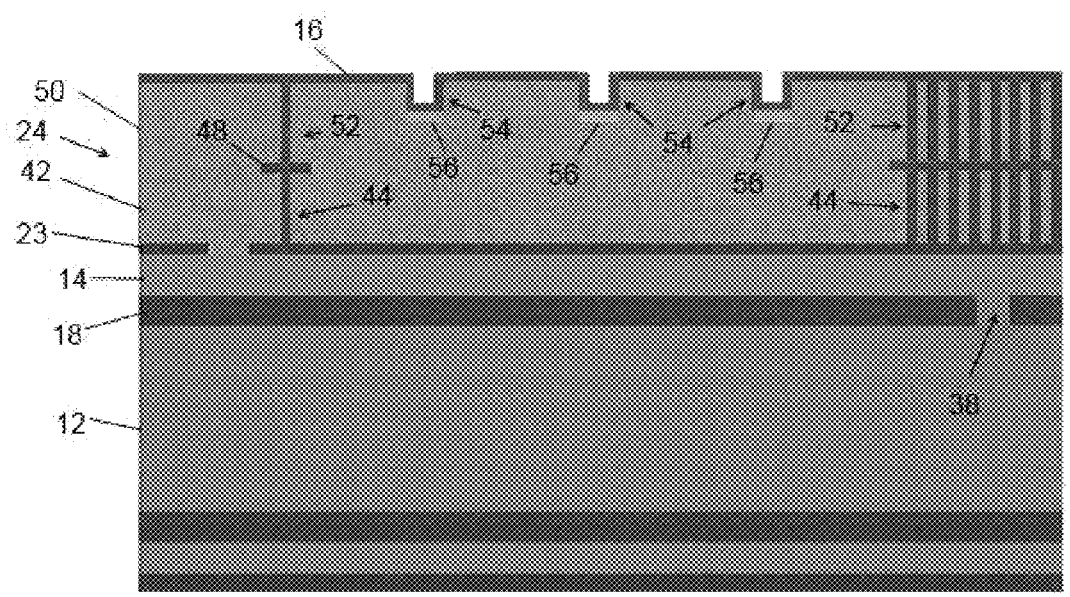
FIG. 5 depicts the substrate of FIG. 4 after the second sacrificial layer has been deposited and the remaining portions of the plug structures formed therein and after the backplate layer has been deposited onto the second sacrificial layer.

As depicted in FIG. 5, a second sacrificial silicon layer 50 is then deposited, e.g. by epitaxial deposition, onto the first sacrificial silicon layer 42. The total width of the silicon layer deposition corresponds to the desired air gap thickness. A planarizing process, such as chemical-mechanical polishing (CMP) may then be performed to ensure a constant and uniform upper surface of the sacrificial silicon is provided at the desired distance from the membrane 14. Plug trenches 52 are then formed in the second sacrificial layer 50 that are aligned with the first plug trenches formed in the first silicon sacrificial layer and that extend down to the horizontal parts of the plug structures. The plug trenches formed in the first sacrificial silicon layer are then filled with an etch-resistant, insulative material, such as SiN or TEOS.

Additional features are then etched into the upper surface of the second sacrificial layer 50 to define the functional shape of the backplate 16. For example, U-shaped trenches 54 are etched into the second sacrificial layer 50 which will define U-shaped folds or corrugations in the backplate 16 for reducing stress, adding mechanical stability, forming over-travel stops, and the like. A metallization layer 56 is deposited and patterned to form an electrode structure in the bottom of the trenches 54. Any suitable type of metal or doped silicon above a protective oxide layer may be used for the metallization. As mentioned above, the metallization may be deposited using an atomic layer deposition (ALD) process as a very thin film, e.g., 10 nm or less, so that it has little or no impact on the mechanical properties of the backplate 16.

Figure 6:
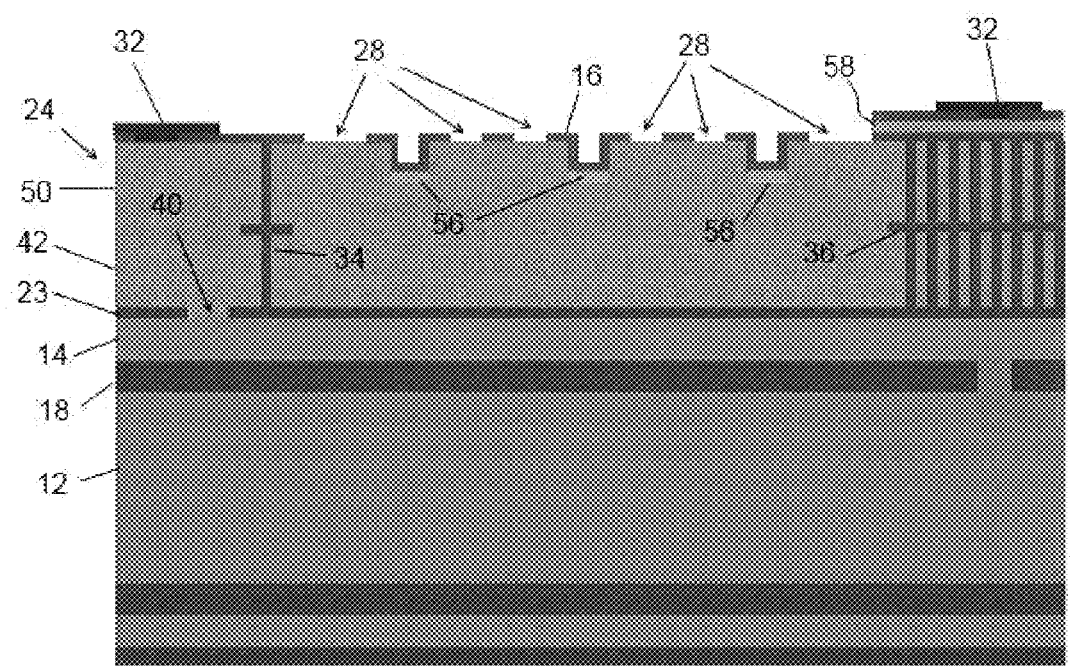
FIG. 6 depicts the substrate of FIG. 5 after the backplate layer has been patterned and the bond pad regions have been formed.

A SiN layer for the backplate 16 is then deposited on top of the second sacrificial layer 50 which conforms to the U-shaped trenches 54 and extends over the plug structures 34, 36. In one embodiment, the SiN layer for the backplate 16 is deposited to a thickness of approximately 1-3 µm. Referring to FIG. 6, the SiN layer is patterned, e.g., by etching, to form the openings or perforations 28 and to define the final shape of the backplate 16. Another metallization layer 58 is then deposited onto the backplate 16 that extends into the bonding region 30 for connecting the backplate 16 to a bonding pad 32. Additional layers and structures may also be provided on the device, such as passivation or insulation layers, packaging structures, mounting structures, and the like.

Referring again to FIG. 1, the fabrication of the MEMS microphone 10 is then completed by forming the backside trench 22, e.g., by etching, using the thermal oxide 18 as an etch stop to protect the membrane and by removing the sacrificial silicon 24 beneath the backplate 16, e.g. by etching, using the thermal oxide layer 23 and the plug structures 34, 36 as etch stops. The thermal oxide layers 18, 23 that remain on the upper and lower surfaces of the membrane 14 are then removed, e.g., using a vHF (vapor hydrofluoric acid) release etch or another suitable procedure. Once the oxide layers 18, 23 have been removed, the acoustic chamber 26 is formed which provides the air gap between the backplate 16 and the membrane of the MEMS microphone.

Although the silicon spacer layer and plug structures have been described as having multiple layers and a stacked configuration, the process may be simplified by using a single sacrificial silicon layer and single level SiN/TEOS plug trench (not shown). In addition, the plug structure 36 that defines a support framework may be omitted or may be provided at other locations or multiple locations where increased electrical resistance and insulation is desired. As depicted in FIG. 1, air gaps may be left in the framework of the plug structure 36. In alternative embodiments, the air gaps may be refilled with SiN/TEOS or another compatible insulating material for improving mechanical stability.

Figure 7:
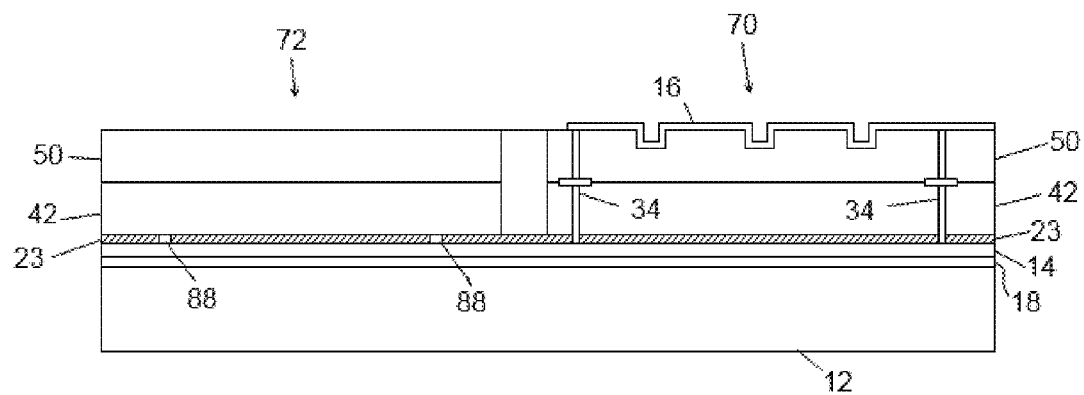
FIG. 7 is a schematic view of an embodiment of a MEMS microphone integrated into the same CMOS substrate with a MEMS pressures sensor.
Figure 8:
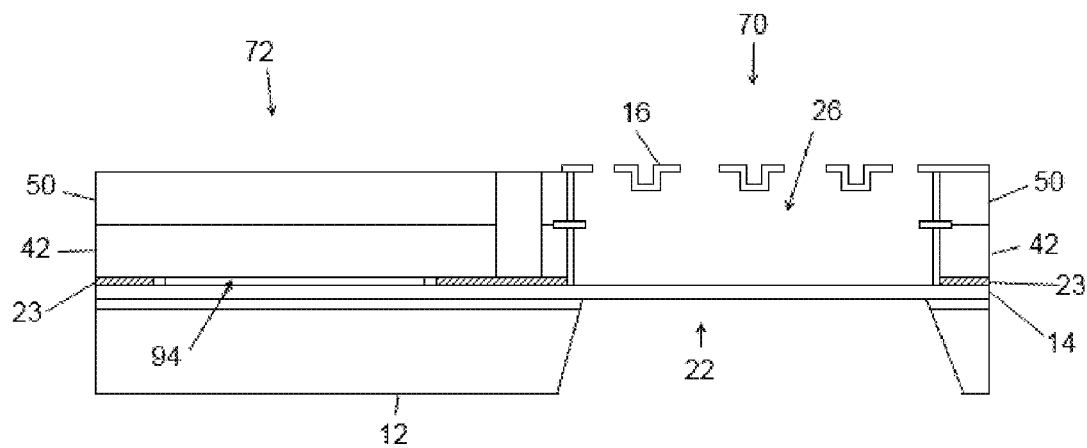
FIG. 8 depicts the substrate of FIG. 7 after the substrate has been processed to form the backside trench and air gap for the MEMS microphone and to form the capacitive gap for the MEMS pressures sensor.

As mentioned above, the use of a SiN backplate with metallization in conjunction with a silicon sacrificial layer enables the MEMS microphone 10 to be fabricated using a CMOS process during normal CMOS flow. As a result, the MEMS microphone 10 may be integrated into other CMOS devices at the chip level. An embodiment of a MEMS microphone 70 incorporated into a MEMS pressures sensor 72 or onto the same chip as a MEMS pressure sensor 7 is depicted in FIGS. 7 and 8. In the embodiment of FIGS. 7 and 8, the device is provided with a similar layer configuration as described above for the MEMS microphone 10, such as a substrate 12, a membrane layer 14, oxide layers 18, 23, a first sacrificial silicon layer 42 and a second sacrificial silicon layer 52 for defining plug structures 34 and features in the backplate layer 16.

The pressure sensor 72 is arranged on the same substrate 12 with the microphone 70 and is configured to utilize the both sacrificial layers 42, 50 to form the flexible membrane or diaphragm for the pressure sensor. In the region of the pressure sensor, the second oxide layer 23 is used as a sacrificial layer for releasing the membrane or diaphragm (e.g., layers 42, 50) that will form the movable electrode for the pressure sensor. Etch stops 88 are formed in the sacrificial oxide 23 for defining the boundary for the gap between the flexible membrane and the polysilicon layer 14 which is configured to serve as the fixed electrode for the pressure sensor 72. As depicted in FIG. 8, the MEMS microphone region of the substrate is processed to form the backside trench 22 and the air gap 26. The MEMS pressure sensor region of the substrate is processed by removing the sacrificial oxide layer to form a capacitive gap 94 for the pressure sensor 70. All of the process steps to form the device of FIG. 8 can be performed during normal CMOS flow.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A microelectromechanical system (MEMS) device comprising:
    a substrate including a backside trench;
    a flexible membrane deposited on the substrate extending over the backside trench, the flexible membrane including a first electrode;
    a silicon spacer layer deposited on a perimeter portion of the flexible membrane, the spacer layer defining an acoustic chamber positioned above the membrane and the backside trench; and
    a silicon rich silicon nitride (SiN) backplate layer deposited on top of the silicon spacer layer extending over the acoustic chamber, the backplate defining a plurality of opening into the acoustic chamber and including a second electrode.

2. The device of claim 1, wherein the backplate layer has a thickness of approximately 1-3 µm.

3. The device of claim 1, wherein the flexible membrane is formed of polysilicon that is doped and patterned to form the first electrode.

4. The device of claim 1, wherein the second electrode comprises a metallization deposited onto the backplate layer.

5. The device of claim 4, wherein the metallization is deposited using an atomic layer deposition (ALD) process to a thickness of 10 nm or less.

6. The device of claim 1, wherein the second electrode comprises a doped silicon layer on top of a thin oxide layer.

7. The device of claim 1, further comprising:
    plug structures formed of an etch-resistant, insulative material that extend between the backplate and the membrane.

8. The device of claim 7, wherein the plug structures are formed of SiN.

9. The device of claim 1, further comprising
bond pad regions adjacent to the backplate; and
bond pads in the bond pad regions for connecting the first and second electrodes to control circuitry.

10. The device of claim 9, further comprising:
a support structure positioned beneath the bond pad region and extending between the bond pad and the substrate, the support structure being formed of SiN.

11. The device of claim 1, further comprising:
a MEMS pressure sensor integrated into the substrate.

12. A method of fabricating a MEMS device, the method comprising:
depositing a conductive layer onto a thermally oxidized substrate configured to serve as a movable electrode for a MEMS microphone;
depositing an oxide layer on an upper surface of the conductive layer;
depositing a sacrificial silicon layer on the oxide layer;
forming plug structures in the sacrificial silicon layer that define a horizontal extent of an air gap for the MEMS device and are configured to serve as etch stops;
depositing a silicon rich silicon nitride (SiN) layer onto the sacrificial silicon layer to serve as a backplate;
depositing a conductive layer adjacent to the SiN backplate layer to serve as fixed electrode for the MEMS microphone; and
etching the sacrificial silicon layer using the oxide layer and the plug structures as etch stops to form an acoustic chamber between the conductive layer and the backplate.

13. The method of claim 12, further comprising:
forming a backside trench in the substrate that exposes an oxide layer on a bottom surface of the conductive layer.

14. The method of claim 13, further comprising:
etching away the oxide layer on the upper surface and the oxide layer on the bottom surface of the conductive layer.

15. The method of claim 14, wherein the plug structures are formed of SiN or tetraethyl orthosilicate (TEOS).

16. The method of claim 15, wherein the SiN backplate layer is deposited to a thickness of 1-3 μm.

17. The method of claim 12, further comprising:
forming a bond pad region adjacent to the backplate; and
providing a SiN plug structure in the sacrificial silicon that extends between the bond region and the conductive layer.

18. The method of claim 17, wherein the SiN plug structure is configured as a support framework, and
wherein the sacrificial silicon layer is removed around the support framework such that air gaps are defined in the plug structure.

19. The method of claim 12, further comprising:
fabricating a MEMS pressure sensor on the substrate.

* * * * *